(12) United States Patent
Bibee

(10) Patent No.: US 7,239,526 B1
(45) Date of Patent: Jul. 3, 2007

(54) PRINTED CIRCUIT BOARD AND METHOD OF REDUCING CROSSTALK IN A PRINTED CIRCUIT BOARD

(75) Inventor: Matthew L. Bibee, Bloomington, MN (US)

(73) Assignee: Xilinx, Inc., San Jose, CA (US)

( * ) Notice: Subject to any disclaimer, the term of this patent is extended or adjusted under 35 U.S.C. 154(b) by 241 days.

(21) Appl. No.: 10/792,141

(22) Filed: Mar. 2, 2004

(51) Int. Cl.
*H01R 12/16* (2006.01)

(52) U.S. Cl. ............................ 361/788; 361/795

(58) Field of Classification Search .............. 361/788, 361/775, 794, 791, 795; 174/262, 261
See application file for complete search history.

(56) References Cited

U.S. PATENT DOCUMENTS

| | | | |
|---|---|---|---|
| 6,608,762 B2 * | 8/2003 | Patriche | 361/788 |
| 6,639,154 B1 * | 10/2003 | Cartier et al. | 174/255 |
| 6,822,876 B2 * | 11/2004 | Goergen | 361/788 |
| 2004/0264153 A1 * | 12/2004 | Payne et al. | |

* cited by examiner

*Primary Examiner*—Dean A. Reichard
*Assistant Examiner*—Yuriy Semenenko
(74) *Attorney, Agent, or Firm*—John J. King

(57) ABSTRACT

The embodiments of the present invention relate to an improved printed circuit board having additional rows of ground vias to reduce crosstalk in the board. A printed circuit board according to one embodiment of the present invention comprises a first row of vias and a second row of vias, each having a plurality of signal vias. The circuit board also comprises a plurality of rows of vias being coupled to a ground plane between the first row of signal vias and the second row of signal vias. According to one embodiment, the plurality of rows of vias being coupled to a ground plane comprise rows of vias having different sizes. Some of the vias are designed to receive a component, while others are generally smaller and designed to provide a return current path for the signal vias.

12 Claims, 4 Drawing Sheets

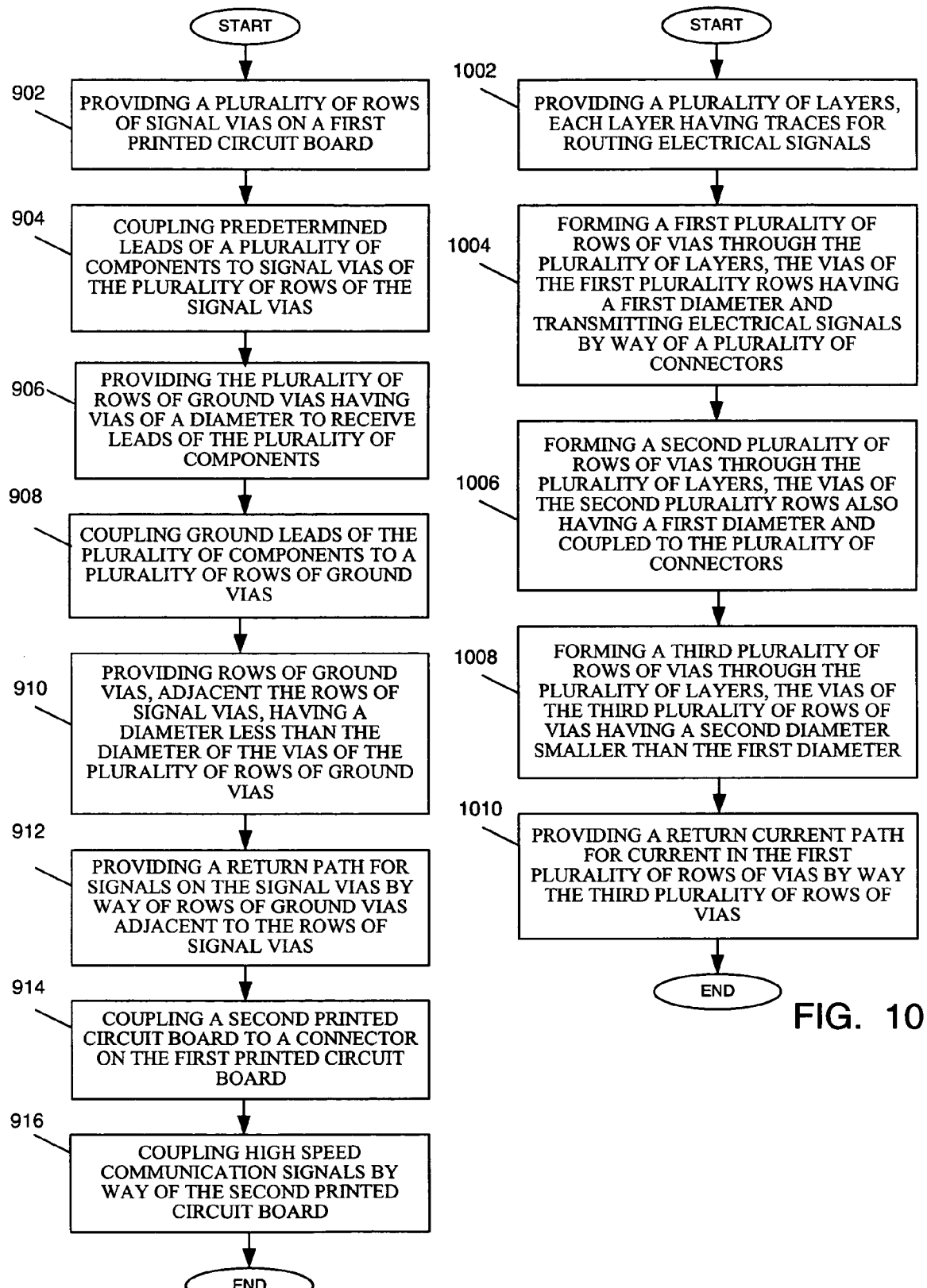

PRINTED CIRCUIT BOARD AND METHOD OF REDUCING CROSSTALK IN A PRINTED CIRCUIT BOARD

FIELD OF THE INVENTION

The present invention relates generally to printed circuit boards, and in particular, to a method of reducing crosstalk in a printed circuit board.

BACKGROUND OF THE INVENTION

Current and future telecommunication switches make extensive use of backplane connectors. These connectors are used to join various system components of a communication switch together. Due to the strong desire on the part of the marketplace for high pin density, these connectors are frequently constructed such that signal pairs are placed in close proximity to one another. A problem that results from this arrangement is that the electric and magnetic fields of signals traversing through the connector interact with one another, causing an undesirable crosstalk between the signals. As data rates continue to increase, the problem of crosstalk will also increase.

High speed serial backplanes are a common media used in the creation of network switches. The backplane is a very thick printed wire board (PWB) or printed circuit board (PCB) with many internal layers whose surface is populated with connectors. The backplane is typically a passive board that serves to interconnect the various connectors on the surface of the board. In general the arrangement of the pins is such that there are rows of pins in a ground-signal-signal-ground (GSSG) arrangement. Adjacent columns of these GSSG will interact both electrically and magnetically. Line cards comprising additional printed circuit boards having dedicated integrated circuits mounted on them are coupled to the backplane. The capabilities of the IC's coupled with the connectivity of the backplane form a complete switch that is capable routing digital data.

Crosstalk can occur in several ways. For high speed communication, two wires are used per data line. The wires themselves can support two forms of EM fields, an even mode and an odd mode. For high-speed digital data transmission, differential signaling is used. Differential signaling corresponds to the odd mode. The receiver in a high-speed differential data transmission system is designed to detect odd mode signals. Along the pair, changes in field configuration occur when there is a physical transition. This can occur for example when the striplines in the backplane hit the backplane connector vias, or signals traveling in the vias hit the actual backplane connector. One impact of these discontinuities is mode conversion (i.e. when an even mode signal is converted into an odd mode signal). A consequence of mode conversion is that it is possible for even mode noise to be converted into an odd mode signal that will be detected at the receiver.

For a victim aggressor scenario where both the victim and aggressor are differential pairs, there are two primary ways for crosstalk to manifest itself on the receiver. Differential signals on the aggressor can affect the odd mode of the victim. Also, even mode signals from the aggressor couple to the victim and the victim pair converts the even mode signal into an odd mode signal. Reducing the ability of modes to couple would substantially reduce the crosstalk.

Network switches enable the transfer of serial digital data within this system at data rates in excess of 1 Gbps (gigabit per second). Many popular forms of encoding of the serial data result in signal frequencies in excess of 1 GHz. At such high frequencies, crosstalk of signals becomes a barrier to effective error free communication. A significant source of crosstalk occurs within the vias of the backplane and printed circuit boards.

Accordingly, there is a need for an improved printed circuit board and method of reducing crosstalk in a printed circuit board.

SUMMARY OF THE INVENTION

The embodiments of the present invention relate to an improved printed circuit board having additional rows of ground vias to reduce crosstalk in the board. A printed circuit board according to one embodiment of the present invention comprises a first row of vias and a second row of vias, each having a plurality of signal vias. The circuit board also comprises a plurality of rows of vias being coupled to a ground plane between the first and second rows of signal vias. According to one embodiment, the plurality of rows of vias being coupled to a ground plane comprise rows of vias having different sizes. Some of the vias are designed to receive a component, while others are generally smaller and designed to provide a return current path for the signal vias.

A method of reducing crosstalk in a printed circuit board is also described. The method generally comprises steps of providing a plurality of rows of signal vias coupling predetermined leads of a plurality of components to signal vias; coupling ground leads of the plurality of components to a plurality of rows of ground vias; and providing a return path for signals on the signal vias by way of rows of ground vias adjacent to the rows of signal vias. A method for forming a printed circuit board designed to reduce crosstalk is also disclosed.

BRIEF DESCRIPTION OF THE DRAWINGS

FIG. 9 is a flow chart showing a method of reducing crosstalk in a printed circuit board according to the present invention; and FIG. 10 is a flow chart showing a method of forming a multi-layer printed circuit board according to the present invention.

DETAILED DESCRIPTION OF THE INVENTION

Figure 1:
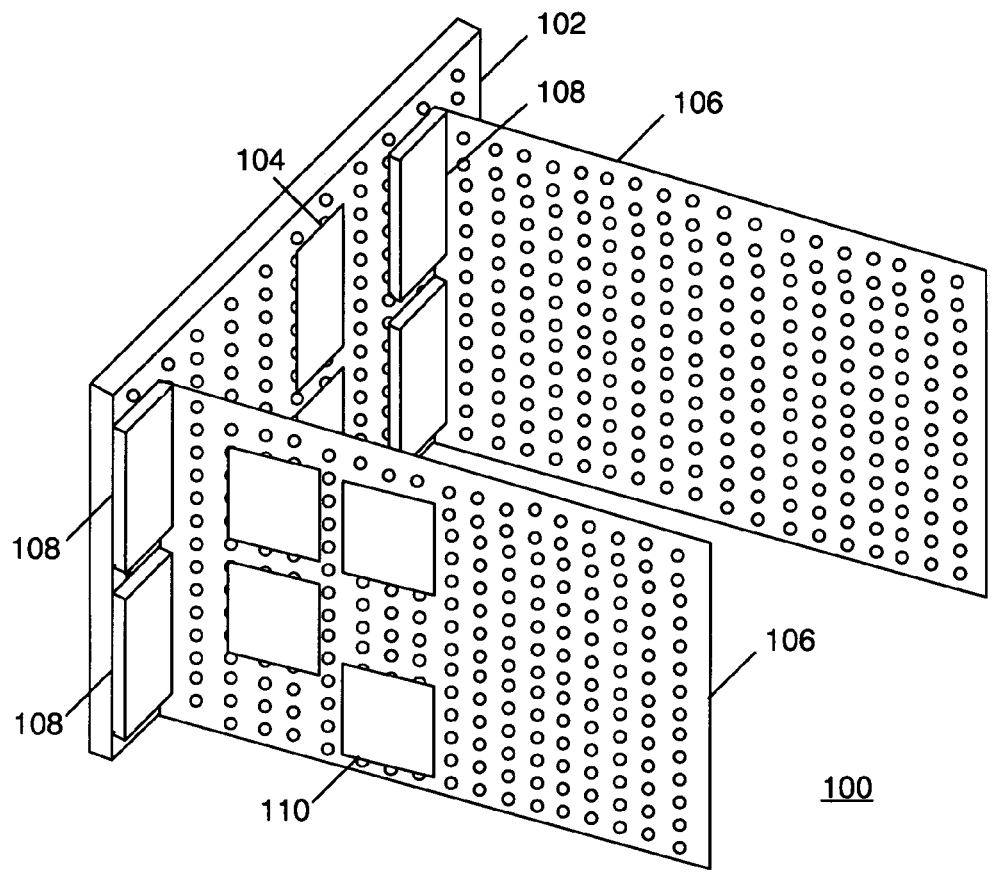
FIG. 1 is a perspective view of a printed circuit board assembly according to an embodiment of the present invention.
Figure 2:
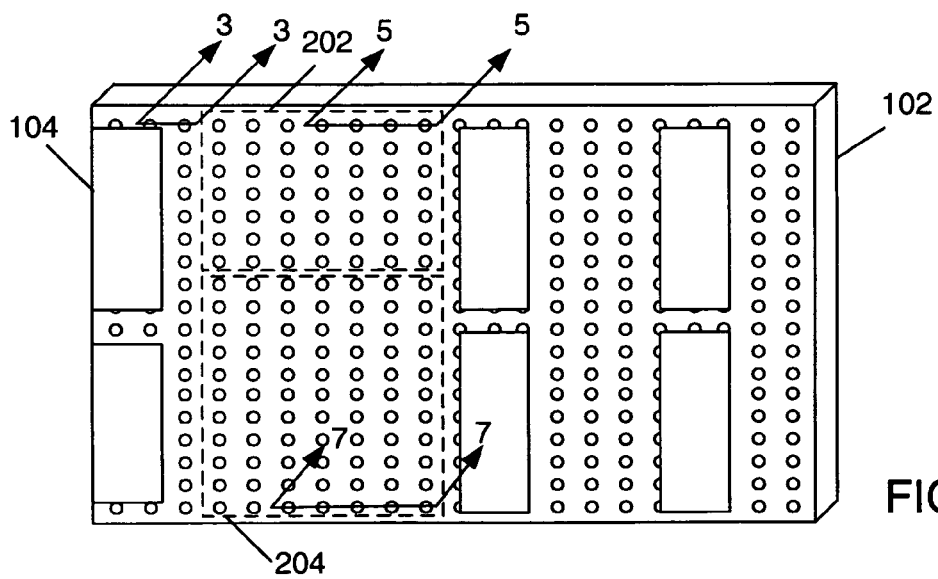
FIG. 2 is a top plan view of the printed circuit board 102 of FIG. 1.
Figure 3:
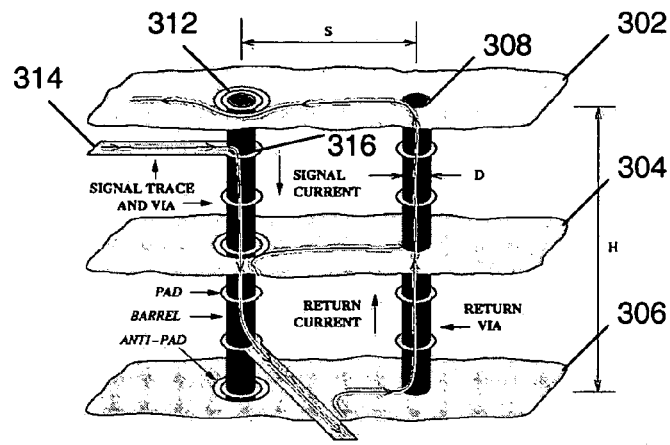
FIG. 3 is a cross sectional view of the printed circuit 102 taken at lines 3—3.

Turning now to FIG. 1, a perspective view of a printed circuit board assembly according to an embodiment of, the present invention is shown. In particular, a printed circuit board 102 comprising a backplane has a plurality of connectors 104. The plurality of connectors are adapted to receive other printed circuit boards 106, such as by way of corresponding connectors 108 on the printed circuit boards 106. As will be described more detail reference to later figures, the embodiments of the present invention enable reduced crosstalk in the printed circuit board by providing additional ground vias which provide additional return paths for signals. As shown in FIG. 2, the top plan view shows printed circuit board 102 of FIG. 1 having a number of vias arranged on the printed circuit board. The printed circuit board could be any type of multi-layer printed circuit board having vias, and finds particular application in a backplane of a circuit board assembly for enabling the transmission of high speed data signals. Cross sectional views of the vias taken at lines 3—3, lines 5—5 and lines 7—7 are shown in FIGS. 3, 5 and 7, respectively. The arrangement of vias of sections 202 and 204 are shown in FIGS. 4 and 6, respectively.

Turning now to FIG. 3, a cross sectional view of the printed circuit 102 is taken at lines 3—3. The ground vias are typically required by the manufacturer to provide mechanical support and allow a method for return current to enter the connector. A plurality of layers 302, 304 and 306 of the printed circuit board include a number of vias 308 and 310 enabling the transmission of signals between the various layers. An anti-pad 312 disconnects via 310 from layer 302. As can be seen, a single trace 314 enables a signal to travel by way of the via 312. A return current travels by way of the via 308 to the layer 302.

Figure 4:
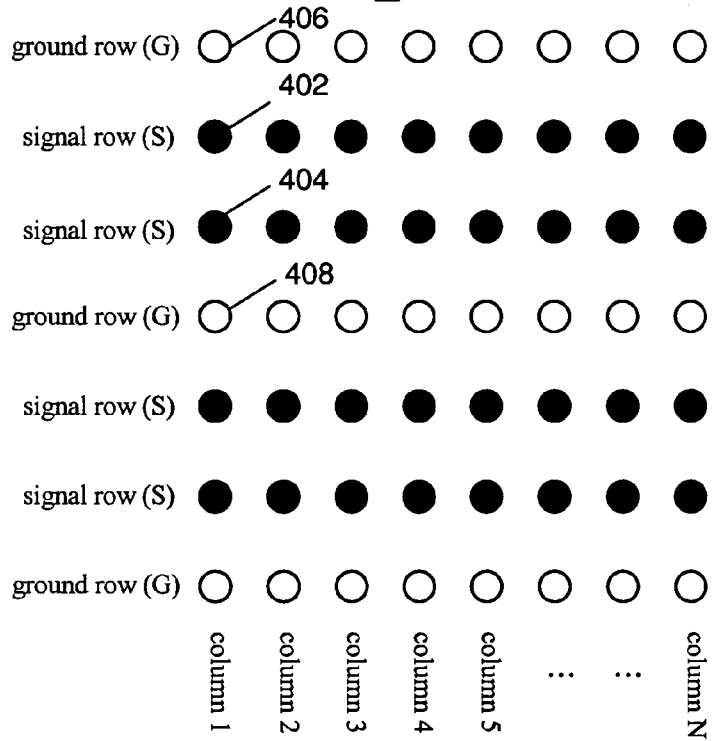
FIG. 4 is an expanded view of the via arrangement of section 202 of the printed circuit board of FIG. 2.
Figure 5:
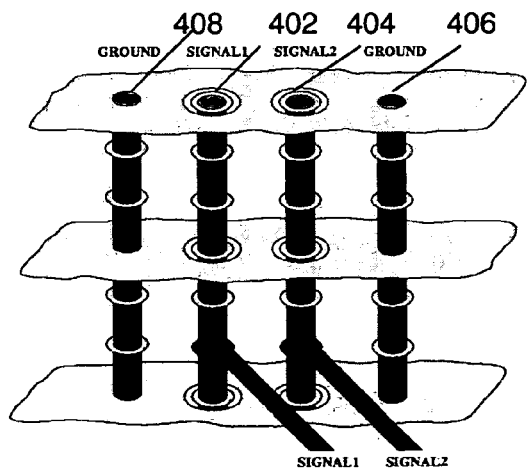
FIG. 5 is a cross sectional view of the printed circuit 102 taken at lines 5—5.

Turning now to FIG. 4, an expanded view of the via arrangement of section 202 of the printed circuit board of FIG. 3 is shown. As can be seen, any two signal rows having signal vias 402 and 404, are position between two ground rows having vias 406 and 408, for example. Such an arrangement provides a ground-signal-signal-ground (GSSG) arrangement. The cross sectional view of the printed circuit 102 taken at lines 5—5 also shows the GSSG arrangement.

Figure 6:
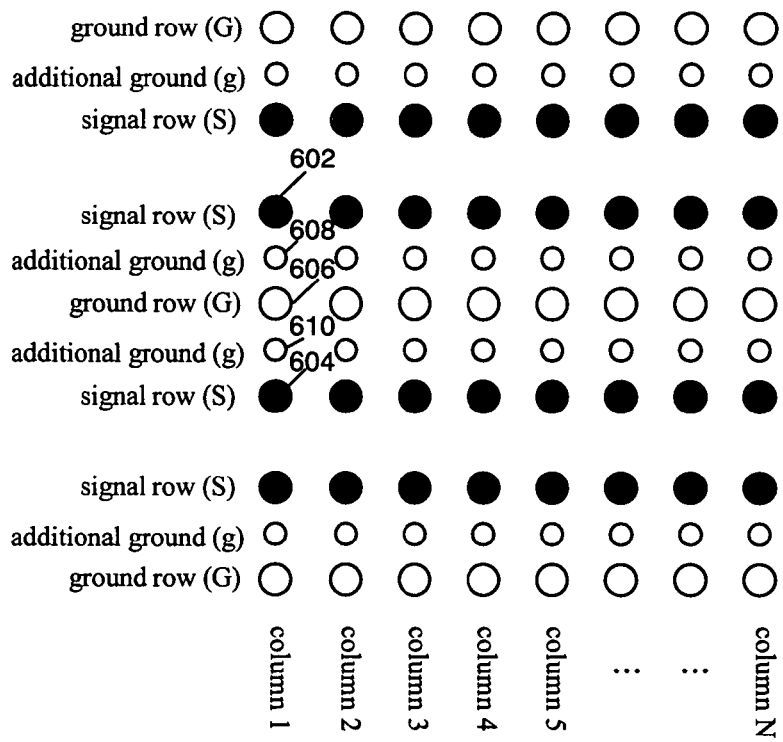
FIG. 6 is an expanded view of the via arrangement of section 204 of the printed circuit board of FIG. 2.
Figure 7:
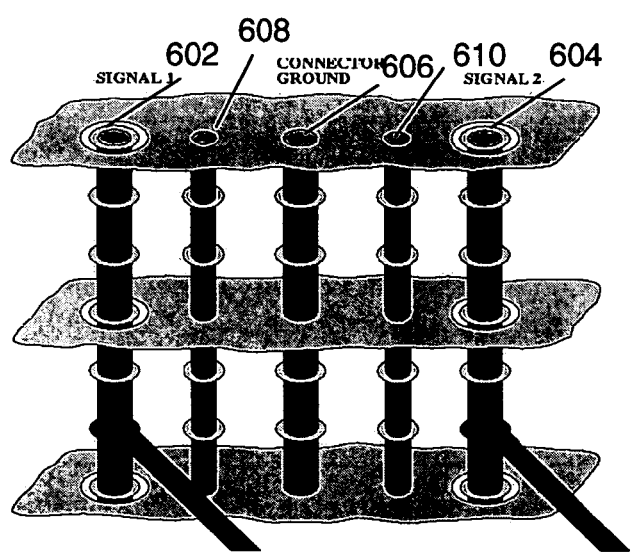
FIG. 7 is a cross sectional view of the printed circuit 102 taken at lines 7—7.

Turning now to FIG. 6, an expanded view of the via arrangement of section 204 of the printed circuit board of FIG. 3 is shown. As shown in FIG. 6, a modification to the board layout according to an embodiment of the present invention provides additional ground rows such that it reduces the ability of ground-signal-signal-ground (GSSG) columns to interact with one another. The additional rows of ground vias (g) are placed in the board to create a new return current path for signals traversing the vias in the board. For example, signal vias 602 and 604, which are large enough to receive a lead of a component, such as a connector, are on either end of a plurality of ground vias. Also, a connector ground row (G) has a via 606 which is also large enough to receive a lead of a component. Additional ground vias 608 and 610 are positioned according to the present invention adjacent to the via rows having signal vias 602 and 604, respectively, and the connector ground row (G) having via 606. As can be seen, three rows of ground vias are positioned between two consecutive rows of signal vias. Although three rows of ground vias are shown, additional rows of ground vias could also be employed according to the present invention.

While providing increased immunity from crosstalk, the arrangement of the embodiment of FIG. 7 does not affect the routing density of the connector. That is, the additional ground vias are preferably of a smaller diameter than the ground vias for receiving components on the board. The additional ground vias provide the electrical function of providing a return path without requiring the space of the ground via rows (G) which are large enough to receive components, such as connectors for receiving a mating connector of a separate printed circuit board, or individual components. The cross sectional view of the printed circuit 102 taken at lines 5—5 of 7 shows how the additional ground vias provide a closer return path for the signal vias. Although the additional ground via rows (g) have vias which have a smaller diameter than the signal vias or the vias of ground via rows (G), the vias of the additional ground via rows (g) could have any diameter, including a diameter of the signal vias or the vias of ground row vias (G). Smaller vias are preferably used to minimize the size requirement of the board. As will be described in greater detail in reference to FIG. 8, the benefit of the addition rows of ground vias is a reduction in the available loop area whereby the electric and magnetic fields of an "aggressive via" can couple into a "victim via."

Figure 8:
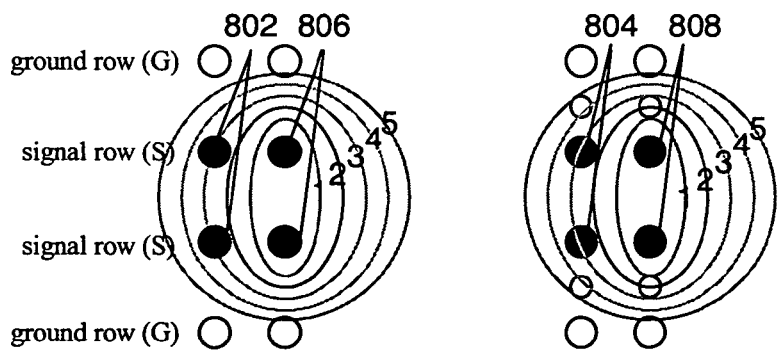
FIG. 8 is a top plan view of via arrangements of sections 202 and 204 showing electrical fields according to the present invention.

Turning now to FIG. 8, a top plan view of via arrangements of section 202 (which comprises a conventional arrangement of vias) and section 204 (which comprises vias arranged according to FIG. 6) shows electrical fields around two adjacent signal vias, and how the embodiment of FIG. 6 reduces the crosstalk in the printed circuit board. By altering the ground placement, return current from the signal vias is forced to run closer to the signal pairs, thereby reducing the available loop area whereby the electric and magnetic fields of an "aggressor via" can couple into a "victim via." As the return current vias are now closer to signal lines, a new differential pair is formed that is less susceptible to crosstalk interference.

Although a via will support modes other than TEM, the following is a first order explanation that assumes TEM fields within the via. The left sides 802 and 804 of each pair are victims and the right sides 806 and 808 of each pair are aggressors. The magnetic (H) field that would be associated with an aggressor has a common mode excitation as shown. All electrical high speed signals are composed of a signal path and a return path. If a line of magnetic flux encircles a signal path and does not encircle a return path, a current is created in the signal path only. This imbalance between signal and return manifests itself as a voltage (i.e. the current induced times the impedance of the line). If a line of magnetic flux encircles both signal and return paths, this impresses a current equally on both signal and return. This is a common mode shift which does not result in any sort of imbalance. For the via arrangement of section 202 on the left, lines 4 and 5 of magnetic flux fully encircle the victim signal pair without also encircling a return path (i.e. a via of a ground row). This introduces a common mode current in the victim pair. In the modified via arrangement of section 204 on the right, only line 4 encircles the victim signal pair without also encircling a return path. That is, line 5 encircles both signal and return paths for each of the aggressor and victim pairs because of additional rows of ground vias, and therefore does not introduce any common mode current in the victim pair. By having the return in closer to the signal lines, the potential for common mode crosstalk to occur is reduced. Because the via is a converter between even and odd modes, any reduction in the amount of even mode noise that is coupled onto a pair would lead to less noise available that can be converted into differential noise.

Turning now to FIG. 9 is a flow chart showing a method of reducing crosstalk in a printed circuit board according to the present invention. A plurality of rows of signal vias are provided at a step 902. Predetermined leads of a plurality of components are coupled to signal vias of the plurality of rows of the signal vias at a step 904. The plurality of rows of ground vias having vias of a diameter to receive leads of the plurality of components are provided at a step 906. Ground leads of the plurality of components are coupled to a plurality of rows of ground vias at a step 908. Rows of ground vias which have a diameter less than the diameter of the vias of the plurality of rows of ground vias are provided adjacent the rows of signal vias at a step 910. A return path for signals on the signal vias are provided by way of rows of ground vias adjacent to the rows of signal vias at a step 912. A second printed circuit board is coupled to a component of the plurality of components at a step 914. Finally, high speed communication signals are provided by way of the printed circuit board at a step 916.

Turning now to FIG. 10, a flow chart shows a method of forming a multi-layer printed circuit board according to the present invention. In particular, a plurality of layers, each layer having traces for routing electrical signals, are formed in a printed circuit board at a step 1002. A first plurality of rows of vias are formed through the plurality of layers at a step 1004. The vias of the first plurality rows have a first diameter and transmit electrical signals by way of a plurality of connectors. A second plurality of rows of vias are formed through the plurality of layers at a step 1006. The vias of the second plurality rows also have a first diameter and are coupled to the plurality of connectors to provide a ground connection. A third plurality of rows of vias are formed through the plurality of layers at a step 1008. The vias of the third plurality of rows of vias have a second diameter smaller than the first diameter. Finally, a return current path for current in the first plurality of rows of vias is provided by way the third plurality of rows of vias at a step 1010.

It can therefore be appreciated that the new and novel printed circuit board and method of reducing crosstalk in a printed circuit board has been described. Although they can be used with any type of printed circuit board, the embodiments of the present invention can be used for any type of backplane connector. As the drilling aspect ratio of PWB vendors improve this approach can find more and more application. It will be appreciated by those skilled in the art that, particular the teaching herein, numerous alternatives and equivalents will be seen to exist which incorporate the disclosed invention. As a result, the invention is not to be limited by the foregoing embodiments, but only by the following claims.

The invention claimed is:

1. A printed circuit board having signal vias and ground vias, said printed circuit board comprising:
    a first row of vias having a plurality of signal vias;
    a second row of vias having a plurality of signal vias, said second row of vias being consecutive with said first row of vias wherein said vias of said second row of vias are aligned in columns with vias of said first row of vias; and
    a plurality of rows of vias between said first row of vias and said second row of vias, said plurality of rows of vias being coupled to a ground plane wherein vias of said plurality of rows of vias between said first row of vias and said second row of vias are aligned in columns with vias of said first row of vias and vias of said second row of vias;
    wherein vias of at least one row of said plurality of rows of vias are adapted to receive leads of a component attached to said printed circuit board.

2. The printed circuit board of claim 1 wherein said plurality of rows of vias comprises at least one row of vias adjacent said first row of vias.

3. The printed circuit board of claim 2 wherein said plurality of rows of vias comprises at least one row of vias adjacent said second row of vias.

4. The printed circuit board of claim 3 wherein one row of said plurality of rows of vias comprises vias having a smaller diameter than vias of said at least one row of said plurality of rows of vias adapted to receive leads of a component.

5. The printed circuit board of claim 2 wherein said plurality of rows of vias between said first row of vias and said second row of vias comprises a row of vias receiving a ground lead of a component.

6. A printed circuit board having signal vias and ground vias, said printed circuit board comprising:
    a pair of rows of vias having signal vias, said signal vias receiving leads of a component;
    a pair of rows of vias having ground vias between said pair of rows of vias having signal vias; and
    a row of vias having ground vias between said pair of rows of vias having ground vias, said ground vias of said row of vias between said pair of rows of vias receiving other leads of said component.

7. The printed circuit board of claim 6 wherein said pair of rows of vias having ground vias does not receive leads of a component.

8. The printed circuit board of claim 6 wherein said pair of rows of vias having ground vias comprises vias having a smaller diameter than said signal vias.

9. The printed circuit board of claim 6 wherein said pair of rows of vias having ground vias provides return current paths for signals in said signal vias.

10. The printed circuit board of claim 6 wherein said vias of said pair of rows of vias having ground vias are aligned with vias of said pair of rows of vias having signal vias.

11. The printed circuit board of claim 6 wherein a first row of vias of said pair of rows of vias having signal vias comprises vias of a first set of differential pairs of signal vias.

12. The printed circuit board of claim 11 wherein a second row of vias of said pair of rows of vias having signal vias comprises vias of a second set of differential pairs of signal vias.

* * * * *